United States Patent
Wu et al.

(10) Patent No.: US 12,016,251 B2
(45) Date of Patent: Jun. 18, 2024

(54) SPIN-ORBIT TORQUE AND SPIN-TRANSFER TORQUE MAGNETORESISTIVE RANDOM-ACCESS MEMORY STACK

(71) Applicant: International Business Machines Corporation, Armonk, NY (US)

(72) Inventors: Heng Wu, Guilderland, NY (US); Alexander Reznicek, Troy, NY (US); Bahman Hekmatshoartabari, White Plains, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 282 days.

(21) Appl. No.: 17/445,831

(22) Filed: Aug. 25, 2021

(65) Prior Publication Data
US 2023/0064289 A1   Mar. 2, 2023

(51) Int. Cl.
| | |
|---|---|
| *H10N 52/80* | (2023.01) |
| *G11C 11/16* | (2006.01) |
| *H01F 10/32* | (2006.01) |
| *H10B 61/00* | (2023.01) |
| *H10N 50/01* | (2023.01) |
| *H10N 50/10* | (2023.01) |
| *H10N 50/85* | (2023.01) |
| *H10N 52/00* | (2023.01) |
| *H10N 52/01* | (2023.01) |

(52) U.S. Cl.
CPC .......... *H10N 52/80* (2023.02); *G11C 11/161* (2013.01); *H01F 10/3254* (2013.01); *H01F 10/329* (2013.01); *H10B 61/20* (2023.02); *H10N 50/01* (2023.02); *H10N 50/10* (2023.02); *H10N 52/00* (2023.02); *H10N 52/01* (2023.02); *G11C 11/1673* (2013.01); *H10N 50/85* (2023.02)

(58) Field of Classification Search
None
See application file for complete search history.

(56) References Cited

U.S. PATENT DOCUMENTS

| | | |
|---|---|---|
| 1,085,426 A | 1/1914 | Hunt |
| 8,130,535 B2 | 3/2012 | Rao |
| 9,337,413 B2 | 5/2016 | Ranjan |

(Continued)

FOREIGN PATENT DOCUMENTS

| | | | |
|---|---|---|---|
| EP | 3839955 A1 | 6/2021 | |
| WO | 2018136003 A1 | 7/2018 | |
| WO | WO-2021109582 A1 * | 6/2021 | ........... H01L 27/222 |

OTHER PUBLICATIONS

Abstract of CN 114429968 (Year: 2022).*

(Continued)

*Primary Examiner* — Kevin M Bernatz
(74) *Attorney, Agent, or Firm* — Gavin Giraud

(57) ABSTRACT

Embodiments disclosed herein include a semiconductor structure. The semiconductor structure may include a spin transfer torque (STT) magnetoresistive random access memory (MRAM) stack. The semiconductor structure may also include a spin orbit torque (SOT) MRAM stack vertically in series with the STT-MRAM. The SOT-MRAM stack may include a heavy metal spin hall effect rail configured to flip an SOT free-layer magnetic orientation in response to a horizontal signal through the heavy metal rail.

7 Claims, 7 Drawing Sheets

(56) References Cited

U.S. PATENT DOCUMENTS

| | | | |
|---|---|---|---|
| 9,741,414 | B2 | 8/2017 | Qiu |
| 10,381,060 | B2 | 8/2019 | Kan |
| 10,452,972 | B2 | 10/2019 | Degraeve |
| 10,490,601 | B2 | 11/2019 | Braganca |
| 10,515,679 | B2 | 12/2019 | Jaiswal |
| 10,552,733 | B2 | 2/2020 | Torng |
| 10,672,455 | B2 | 6/2020 | Torng |
| 10,749,106 | B2 | 8/2020 | Adelmann |
| 11,915,734 | B2 * | 2/2024 | Hashemi ............ G11C 11/1673 |
| 2009/0218645 | A1 | 9/2009 | Ranjan |
| 2018/0151210 | A1 | 5/2018 | Li |
| 2019/0147929 | A1 * | 5/2019 | Sasaki .................... G11C 11/16 |
| | | | 365/158 |
| 2019/0334080 | A1 * | 10/2019 | Ahmed ............... G11C 11/1673 |
| 2020/0005861 | A1 * | 1/2020 | O'Brien ............. H01F 10/3272 |
| 2020/0035909 | A1 * | 1/2020 | Sun ...................... H10N 52/101 |
| 2020/0136018 | A1 * | 4/2020 | Ying ...................... H10N 50/01 |
| 2020/0285394 | A1 | 9/2020 | Park |
| 2020/0312394 | A1 * | 10/2020 | Le ......................... H10N 50/10 |
| 2021/0327960 | A1 * | 10/2021 | Xiao ..................... H10N 50/85 |
| 2021/0351344 | A1 * | 11/2021 | Tseng .................... H10B 61/00 |
| 2022/0148635 | A1 * | 5/2022 | Yogendra ............ H01F 10/3254 |
| 2022/0254991 | A1 * | 8/2022 | Chia ..................... G11C 11/161 |
| 2023/0027792 | A1 * | 1/2023 | Chiu ..................... H10N 50/10 |
| 2023/0040768 | A1 * | 2/2023 | Frougier ................ H10N 50/01 |
| 2023/0089984 | A1 * | 3/2023 | Wu ........................ H10B 61/00 |
| | | | 257/421 |

OTHER PUBLICATIONS

"Patent Cooperation Treaty PCT Notification of Transmittal of the International Search Report and the Written Opinion of the International Searching Authority, or the Declaration", Applicant's file reference P202000246, International application No. PCT/EP2022/071112, International filing date Jul. 27, 2022 (Jul. 27, 2022), Date of Mailing Dec. 7, 2022 (Jul. 12, 2022), 14 pages.

Wang et al., "Training Deep Neural Networks with 8-bit Floating Point Numbers", Proceedings of the 32nd Conference on Neural Information Processing Systems (NeurIPS 2018), Dec. 3-8, 2018, Montréal, Canada, arXiv, Cornell University, 1812.08011v1, Dec. 19, 2018, 11 pages, <https://arxiv.org/abs/1812.08011>.

* cited by examiner

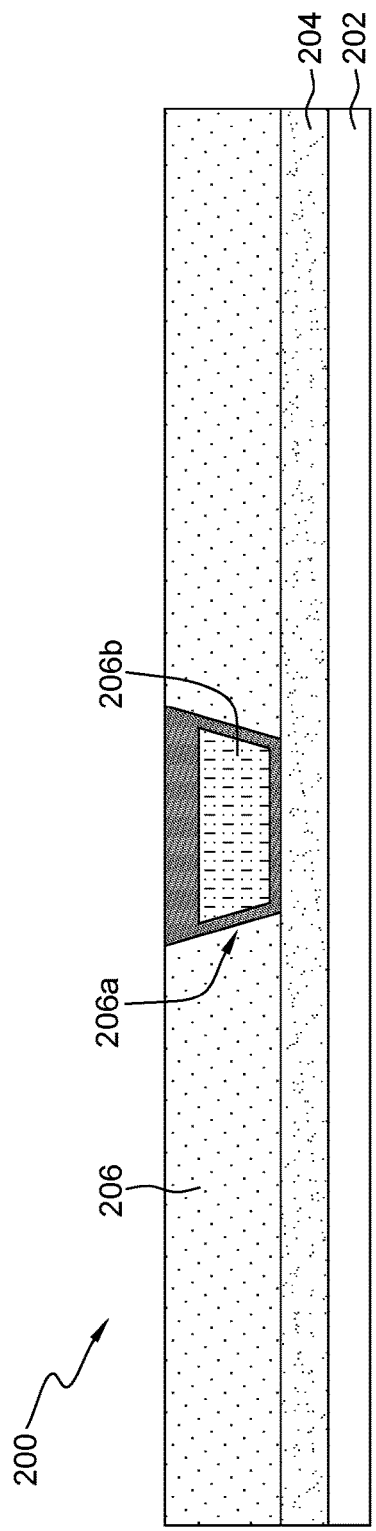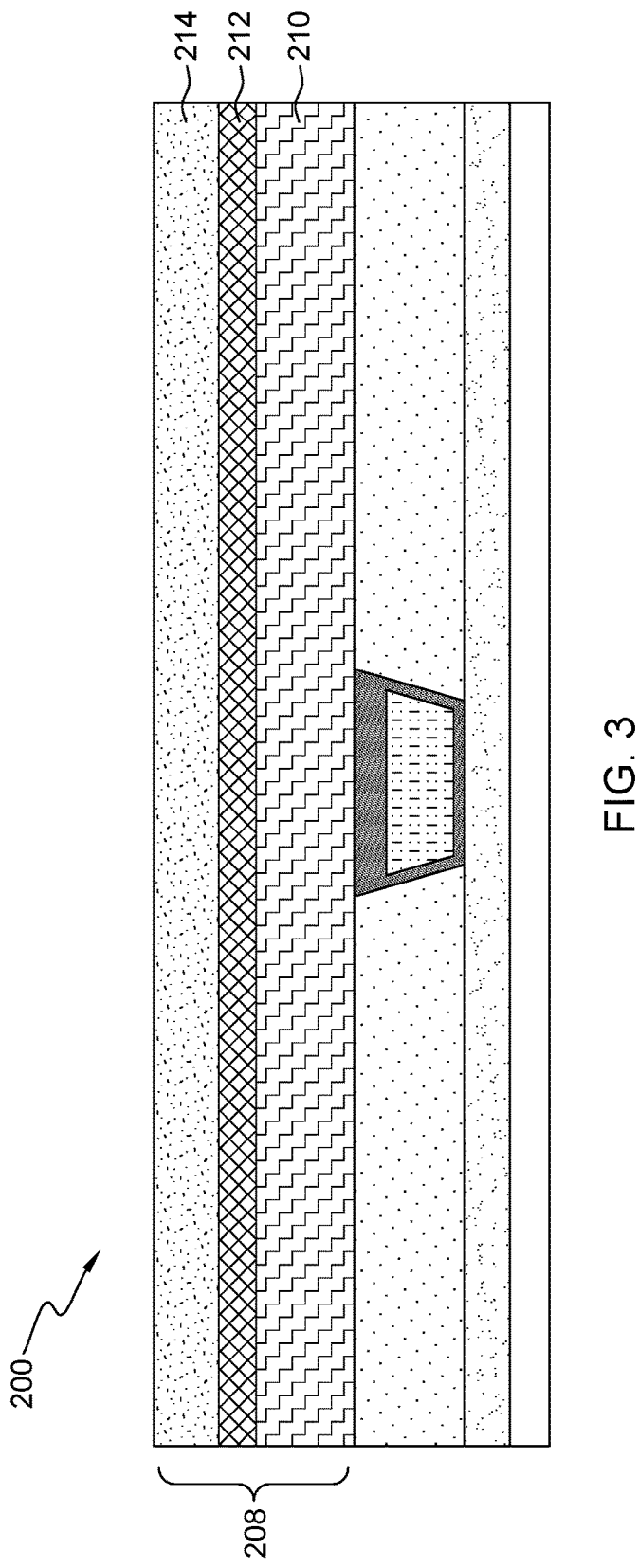

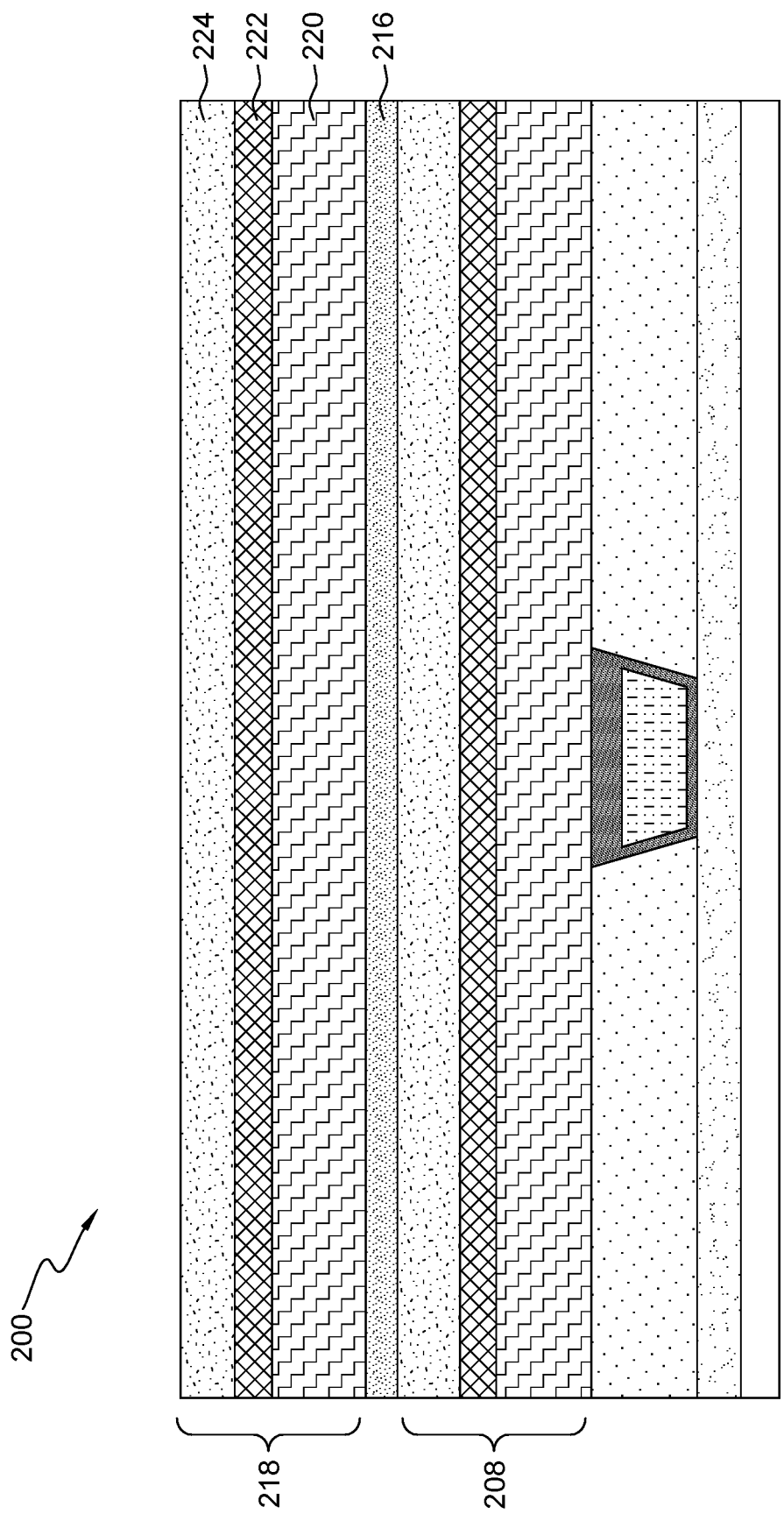

SPIN-ORBIT TORQUE AND SPIN-TRANSFER TORQUE MAGNETORESISTIVE RANDOM-ACCESS MEMORY STACK

BACKGROUND

The present invention relates generally to the field of magnetic random access memory (MRAM), and more particularly to structures and fabricating techniques for a spin orbit torque (SOT) MRAM that enables four-state operation.

MRAM is a type of non-volatile random-access memory (RAM) which stores data in magnetic domains. Unlike conventional RAM technologies, data in MRAM is not stored as electric charge or current flows, but by magnetic storage elements formed from two ferromagnetic plates, each of which can hold a magnetization, separate by a thin insulating layer. One of the two plates is a permanent magnet set to a particular polarity. The other plate's magnetization can be changed to match that of an external field to store memory.

Spin-transfer torque MRAM (STT-MRAM) is a non-volatile memory with near-zero leakage power consumption which is a major advantage over charge-based memories such as static RAM (SRAM) and dynamic RAM (DRAM). STT-MRAM is a two-terminal device that uses spin-aligned (e.g., polarized) electrons to directly torque the domains. Specifically, if the electrons flowing into a layer have to chain their spin, this will develop a torque that will be transferred to a nearby layer. This lowers the amount of current needed to write cells, making it about the same as the read process.

Spin-orbit torque (SOT) MRAM separates the read and write path of the memory. SOT-MRAM devices feature a switching of the free magnetic layer done by injecting an in-plane current in an adjacent SOT layer, unlike STT-MRAM where the current is injected perpendicularly into the magnetic tunnel junction (MTJ) and the read and write operation is performed through the same path.

SUMMARY

Aspects of an embodiment of the present invention include a semiconductor structure. The semiconductor structure may include a spin transfer torque (STT) magnetoresistive random access memory (MRAM) stack. The semiconductor structure may also include a spin orbit torque (SOT) MRAM stack vertically in series with the STT-MRAM. The SOT-MRAM stack may include a heavy metal rail configured to flip an SOT free-layer magnetic orientation in response to a horizontal signal through the heavy metal rail.

Aspects of an embodiment of the present invention include methods of fabricating a semiconductor structure. The methods may include forming a spin transfer torque (STT) magnetoresistive random access memory (MRAM) stack on a device wafer. The methods may also include forming a spin orbit torque (SOT) MRAM stack on the STT-MRAM stack. The SOT-MRAM stack may be formed with a heavy metal rail configured to flip an SOT free-layer magnetic orientation in response to a horizontal signal through the heavy metal rail.

Aspects of an embodiment of the present invention include a method. The method may include forming a STT reference layer comprising an STT fixed magnetic field on a device wafer. The method may also include forming an STT free layer configured to flip an STT magnetic orientation in response to a vertical signal through the STT reference layer and the STT free layer. The method may also include forming a SOT reference layer comprising an SOT fixed magnetic field vertically above and electrically in series with the STT free layer. The method may also include forming an SOT free layer configured to flip an SOT magnetic orientation in response to a second vertical signal through the SOT reference layer and the SOT free layer. The method may also include forming a heavy metal rail on the SOT free layer configured to flip the free-layer magnetic orientation in response to a horizontal signal through the heavy metal rail.

BRIEF DESCRIPTION OF THE DRAWINGS

FIG. 2 depicts a cross-sectional side view of a semiconductor structure, with like reference numerals of previous figures referring to like features, and at a fabrication stage of the processing method that is subsequent to the directly previous figure, in accordance with one embodiment of the present invention;

FIG. 3 depicts a cross-sectional side view of a semiconductor structure, with like reference numerals of previous figures referring to like features, and at a fabrication stage of the processing method that is subsequent to the directly previous figure, in accordance with one embodiment of the present invention;

FIG. 4 depicts a cross-sectional side view of a semiconductor structure, with like reference numerals of previous figures referring to like features, and at a fabrication stage of the processing method that is subsequent to the directly previous figure, in accordance with one embodiment of the present invention;

DETAILED DESCRIPTION

Figure 1:
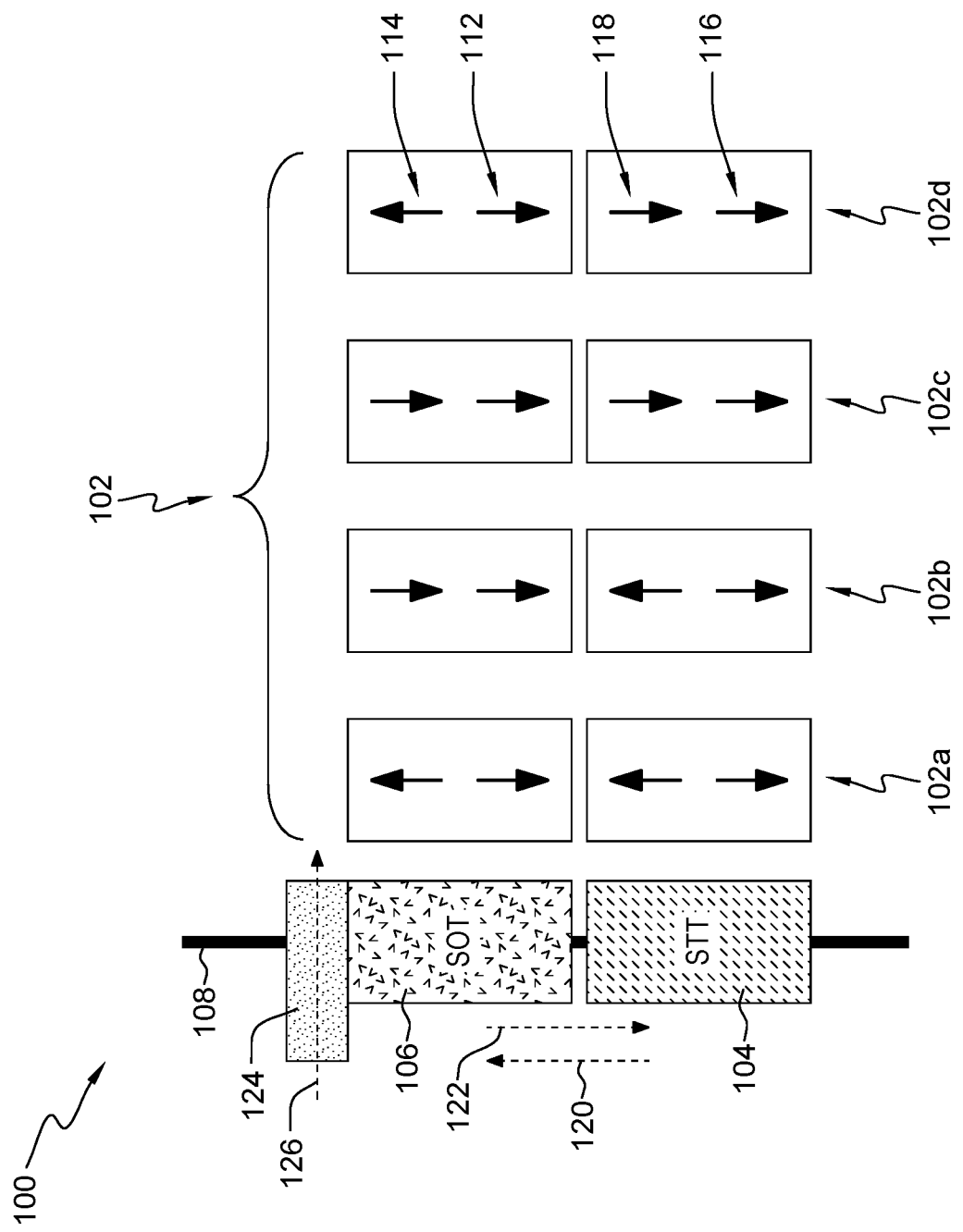
FIG. 1 depicts schematic diagram of a semiconductor structure having resistance states, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Multiplication operations (including convolution and matrix multiplication) are the most area-consuming and power-consuming component in hardware implementation of deep neural networks. Some experiments suggest that at least a portion of multiplication operations may be performed at lower precision (i.e. with a fewer number of bits) without compromising the end-to-end accuracy. This provides opportunity for power and/or area saving by employing analog devices such as magnetoresistive random access memory (MRAM) for weight storage. However, the binary program state of MRAM (i.e. −1 with spin-down or +1 with spin-up) is typically not sufficient for preserving accuracy. Spin-orbit torque (SOT)-MRAM has emerged as a faster and higher reliability alternative to conventional MRAM; nevertheless, the issues outlined above also apply to SOT-MRAM.

The embodiments disclosed herein include structures and fabrication methods that enable semiconductor structures with multiple states (i.e., four different resistance states: 00, 01, 10, 11) by stacking a SOT-MRAM on a spin-transfer torque (STT)-MRAM. When utilized for weight storage, the disclosed semiconductor structures enable artificial intelligence (AI) chips which may be used for inference with no loss in the prediction accuracy. In certain embodiments, weights associated with convolutional and fully-connected layers of a neural network are stored in the disclosed SOT-MRAM devices. The disclosed embodiments enable area and power saving compared to conventional methods due to (i) low-power SOT-MRAM switching and (ii) reduced number of bits. Thus, the embodiments require less hardware and operations for multiplication.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Each reference number may refer to an item individually or collectively as a group. For example, SOT-MRAM stack 106 may refer to a single SOT-MRAM stack 106 or multiple SOT-MRAM stacks 106.

The present invention will now be described in detail with reference to the Figures.

FIG. 1 depicts a schematic view of a semiconductor structure 100, and four logic states 102 at which the semiconductor structure 100 may operate. The semiconductor structure 100 includes an STT-MRAM stack 104 and an SOT-MRAM stack 106 electrically in series. That is, the semiconductor structure 100 includes a vertical conductive path 108 that propagates an electrical signal vertically through the STT-MRAM stack 104 and then immediately through the SOT-MRAM stack 106, or vertically through the SOT-MRAM stack 106 and then immediately through the STT-MRAM stack 104. Each MRAM (i.e., STT-MRAM stack 104 and SOT-MRAM stack 106) includes magnetic fields oriented in a direction represented by arrows in FIG. 1. Specifically, the STT-MRAM 104 includes a STT fixed magnetic orientation 112 and an STT free magnetic orientation 114, and the SOT-MRAM stack 106 includes a SOT fixed magnetic orientation 116 and an SOT free magnetic orientation 118. The STT fixed magnetic orientation 112 and the SOT fixed magnetic orientation 116 remain fixed in an orientation (i.e., illustrated as down in FIG. 1), but the STT free magnetic orientation 114 and the SOT free magnetic orientation 118 are switchable based on signals through the semiconductor structure 100. The switchable free magnetic fields 114, 118 enable the logic states 102 due to variances in the resistance provided by the STT-MRAM stack 104 and the SOT-MRAM stack 106.

For example, in a first logic state 102a of the semiconductor structure 100, the STT free magnetic orientation 114 is opposite (i.e., up) of the STT fixed magnetic orientation 112 (i.e., down), and the SOT free magnetic orientation 116 is opposite (i.e., up) of the SOT fixed magnetic orientation 116 (i.e., down). This configuration of magnetic orientations provides a "00" logic state that is a highest resistance of the possible logic states of the semiconductor structure 100 when detected by a read voltage. That is, the STT-MRAM stack 104 and the SOT-MRAM stack 106 each have a high resistance state and a low resistance state, and the 00 logic state is indicated to the read circuit as the in-series resistance of the high resistance for the STT-MRAM stack 104 plus the high resistance for the SOT-MRAM stack 106.

In a second logic state 102b of the semiconductor structure 100, the STT free magnetic orientation 114 is opposite (i.e., up) of the STT fixed magnetic orientation 112 (i.e., down), and the SOT free magnetic orientation 116 is parallel (i.e., down) to the SOT fixed magnetic orientation 116 (i.e., down). This configuration of magnetic orientations provides a "01" logic state, with a resistance that is less than the 00 logic state when read through the use of a read voltage. That is, the 01 logic state is indicated to the read circuit as the in-series resistance of the high resistance value for the STT-MRAM stack 104 plus the low resistance value for the SOT-MRAM stack 106.

A logic control circuit changes the logic state of the semiconductor structure 100 using vertical signals through the STT-MRAM stack 104 and the SOT-MRAM stack 106, and horizontal signals through a heavy metal spin hall effect (SHE) rail 124 directly in contact with the SOT-MRAM stack 106. Specifically, the logic control circuit sends a state-change signal such that electrons flow in a vertically up direction 120 or a vertically down direction 122 through the conductive path 108 of the STT-MRAM stack 104 and the SOT-MRAM stack 106. Additionally, the logic control circuit may utilize a horizontal signal 126 through the heavy metal SHE rail 124 to flip the SOT free-layer magnetic orientation 118 in response to a horizontal signal through the heavy metal SHE rail 124. The state-change signal is typically higher than the read signal. A combination of direction, voltage, and duration of the state-change signal change the state from the first logic state 102a to the second logic state 102b.

In a third logic state 102c of the semiconductor structure 100, the STT free magnetic orientation 114 is parallel (i.e., down) to the STT fixed magnetic orientation 112 (i.e., down), and the SOT free magnetic orientation 116 is also parallel (i.e., down) to the SOT fixed magnetic orientation 116 (i.e., down). This configuration of magnetic orientations provides a "11" logic state, with a resistance that is less than the 00 logic state when read through the use of a read voltage. That is, the 11 logic state is indicated to the read circuit as the in-series resistance of the low resistance value for the STT-MRAM stack 104 plus the low resistance value for the SOT-MRAM stack 106.

The logic control circuit sends another combination of direction (e.g., vertically down 120, vertically up 122, or horizontally 126 through the heavy metal SHE rail 124), voltage, and duration of the state-change signal to change the state from the second logic state 102b to the third logic state 102c. The state-change signal is typically higher than the read signal.

In a fourth logic state 102d of the semiconductor structure 100, the STT free magnetic orientation 114 is parallel (i.e., down) to the STT fixed magnetic orientation 112 (i.e., down), and the SOT free magnetic orientation 116 is opposite (i.e., up) to the SOT fixed magnetic orientation 116 (i.e., down). This configuration of magnetic orientations provides a "10" logic state, with a resistance that is less than the 00 logic state when read through the use of a read voltage. That is, the logic state is indicated to the read circuit as the in-series resistance of the low resistance value for the STT-MRAM stack 104 plus the high resistance value for the SOT-MRAM stack 106. The semiconductor structure 100 includes specific designated values for the low and high resistance of the STT-MRAM stack 104 and for the low and high resistance of the SOT-MRAM stack 106. The read circuit is programmed with these specific resistance for the purpose of determining the logic state (i.e., 00, 01, 11, or 10) based on the resistance that is read from the semiconductor structure 100.

When changing the states of the stacks 104, 106, the logic control circuit is able to send a state-change signal in the horizontal direction 126 through the heavy metal SHE rail 124 to change only the SOT-MRAM stack 106. The ability to control the SOT-MRAM stack 106 individually means that the semiconductor structure 100 can be set in four logic states. The four-state logic of the semiconductor structure 100 thus enables a more compact and efficient memory circuit. The fabrication of an embodiment of a semiconductor structure will be discussed below.

FIG. 2 depicts a cross-sectional view of a semiconductor structure 200 at a fabrication stage of the processing method, in accordance with one embodiment of the present invention. The semiconductor structure 200 includes a front end of line (FEOL) layer 202 that is not necessarily to scale. The FEOL layer 202 includes transistors (not pictured) that may be fabricated using known techniques. Above the FEOL layer 202 the semiconductor structure 200 includes a first metal layer 204. The first metal layer 204 includes not just metal, but also dielectrics, contacts, and vias for sending and reading signals to the transistors in the FEOL layer 202. Above the first metal layer 204, the semiconductor structure 200 includes a second metal layer 206 with dielectrics, contacts, and vias. The second metal layer 206 is illustrated specifically with a bottom electrode 206a and a bottom electrode core 206b (other unillustrated electrodes, dielectric components, contacts, and/or vias may be present). The bottom electrode 206a and the bottom electrode core 206b are made of electrically conductive material, and certain embodiments of the bottom electrode core 206b may include copper. The bottom electrode 206a electrically connects the additional layers of the semiconductors structure 200 to the first metal layer 204 and the FEOL layer 202.

FIG. 3 depicts a cross-sectional view of the semiconductor structure 200 at a fabrication stage of the processing method, in accordance with one embodiment of the present invention. The semiconductor structure 200 includes magnetic tunnel junction (MTJ) layers 208 that may be fabricated using deposition techniques such as chemical vapor deposition (CVD), atomic layer deposition (ALD), and/or physical vapor deposition (PVD). The MTJ layers 208 include an STT reference layer 210, an STT tunnel barrier 212, and an STT free layer 214. The STT reference layer 210 may be made of a ferromagnetic material such as NiFe, NiFeCo, CoFe, CoFeB, Co, Ni, Cu, Ta, Ti, Zr, Au, Ru, Cr, Pt, CoPt, CoCrPt, FeNi, FeTa, FeTaCr, FeAl, FeZr, NiFeCr, or NiFeX. The ferromagnetic material enables a permanent magnetic field to be maintained in a fixed orientation. For example, as shown in FIG. 1, the magnetic field may be fixed in a down orientation. The STT tunnel barrier 212 may be made of magnesium oxide, magnesium aluminum oxide, aluminum oxide, combinations of these, or other dielectric materials. The STT free layer 214 is made of a magnetic material that enables the magnetic orientation to switch depending on a signal passed vertically through the finished STT-MRAM device (as described above with regard to FIG. 1). In general, the STT free layer 214 comprises a ferromagnetic layer capable of changed in magnetization state. In some embodiments, the STT free layer 214 is a composite free layer that includes multiple ferromagnetic and coupling sub-layers.

FIG. 4 depicts a cross-sectional view of the semiconductor structure 200 at a fabrication stage of the processing method, in accordance with one embodiment of the present invention. The semiconductor structure 200 includes a metal layer 216 and additional MTJ layers 218 for the eventual SOT-MRAM stack. The additional MTJ layers 218 include an SOT reference layer 220, an SOT tunnel barrier 222, and an SOT free layer 224. The SOT reference layer 220 may also be made of a ferromagnetic material such that a permanent magnetic field is maintained in a fixed orientation. For example, as shown in FIG. 1, the magnetic field may be fixed in a down orientation. The SOT tunnel barrier 222 may be made of magnesium oxide, magnesium aluminum oxide, aluminum oxide, combinations of these, or other dielectric materials. The SOT free layer 224 is made of a magnetic material that enables the magnetic orientation to switch depending on a signal passed vertically through the finished SOT-MRAM device (as described above with regard to FIG. 1).

Figure 5:
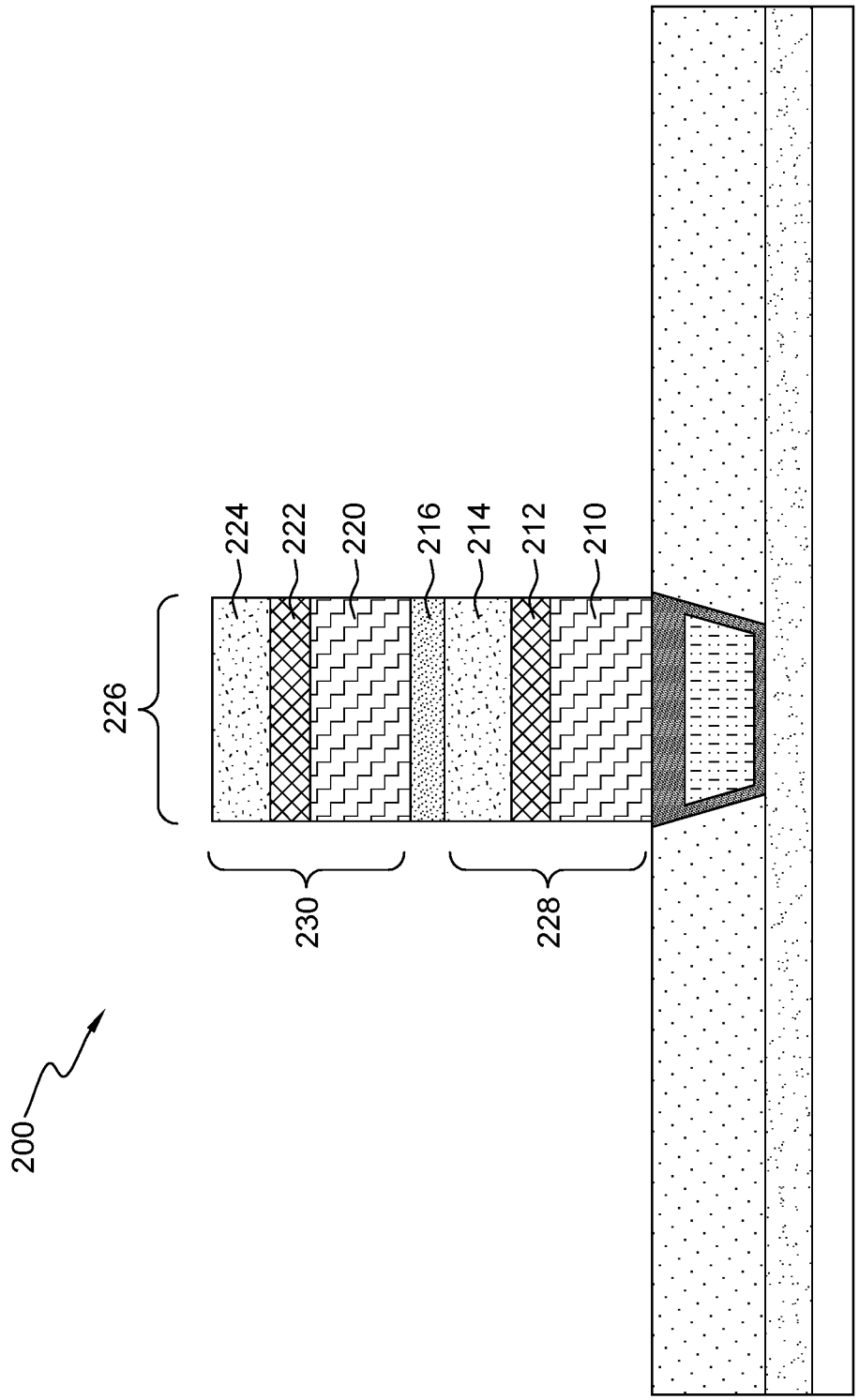
FIG. 5 depicts a cross-sectional side view of a semiconductor structure, with like reference numerals of previous figures referring to like features, and at a fabrication stage of the processing method that is subsequent to the directly previous figure, in accordance with one embodiment of the present invention.

FIG. 5 depicts a cross-sectional view of the semiconductor structure 200 at a fabrication stage of the processing method, in accordance with one embodiment of the present invention. The semiconductor structure 200 is etched so that the MRJ layer 208 and the additional MTJ layers 218 form a pillar 226 that includes a STT-MRAM stack 228 and a SOT-MRAM stack 230. In embodiments of the present invention, the pillar 226 may be formed by an etching process or a selective etching process that selectively removes the MRJ layers 208 and the additional MTJ layers 218 around the pillar 226. In some embodiments, this etching can be performed using an anisotropic etch such as reactive ion etching (RIE). Masking material (not shown) may be applied to the top of the semiconductor structure 200 (i.e., to the top of the SOT free layer 224), prior to etching, which resists etching and can be utilized to form the desired shape of the pillar 226, such as, for example, the shape depicted in FIG. 4. In some embodiments, the masking material may be a photoresist which has been patterned using photolithography.

Figure 6:
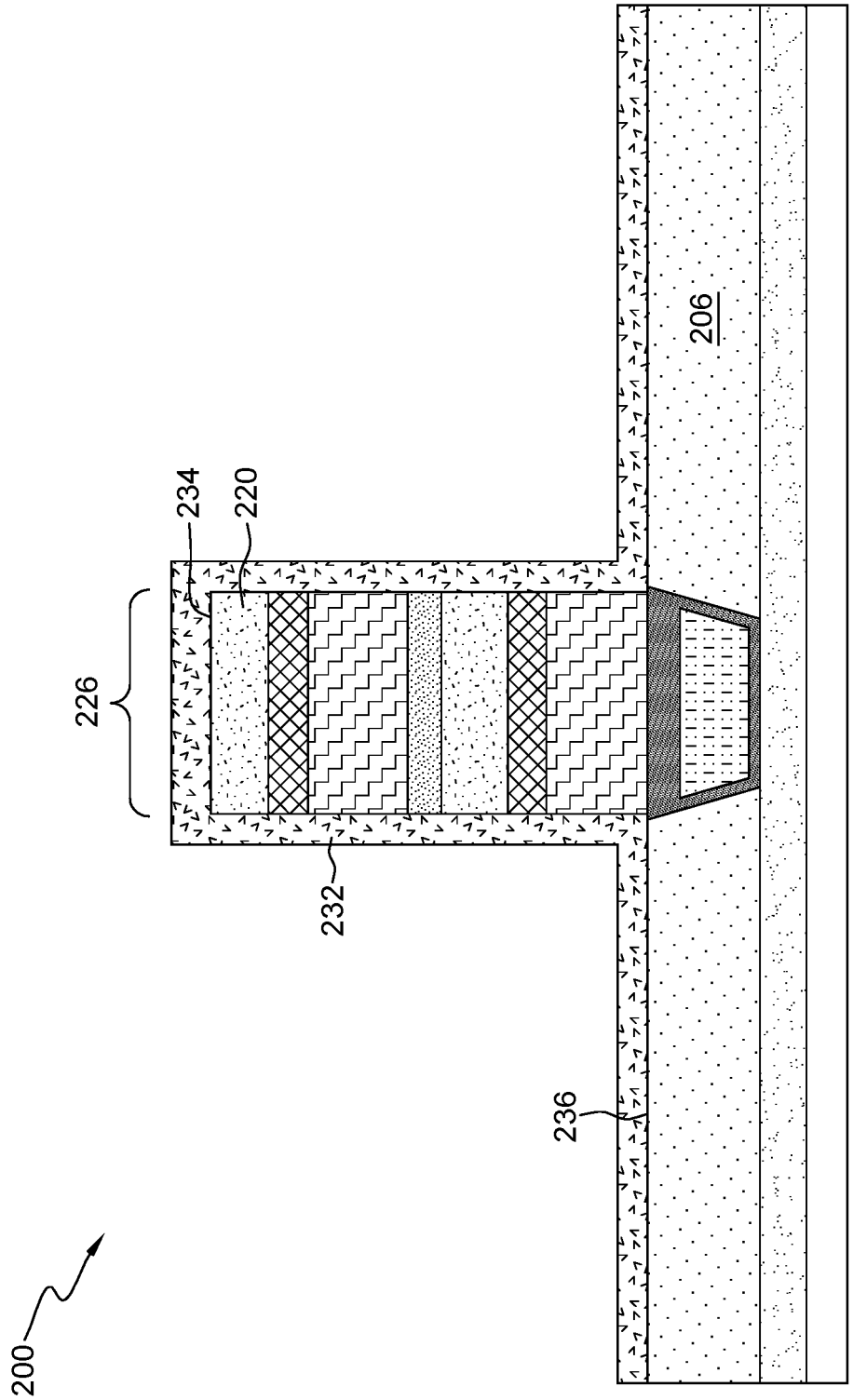
FIG. 6 depicts a cross-sectional side view of a semiconductor structure, with like reference numerals of previous figures referring to like features, and at a fabrication stage of the processing method that is subsequent to the directly previous figure, in accordance with one embodiment of the present invention.

FIG. 6 depicts a cross-sectional view of the semiconductor structure 200 at a fabrication stage of the processing method, in accordance with one embodiment of the present invention. FIG. 6 shows the formation of an encapsulation layer 232 that may be formed as a blanket layer by any known deposition process. For example, chemical vapor deposition (CVD), plasma enhanced chemical vapor deposition (PECVD), physical vapor deposition (PVD), sputtering, atomic layer deposition (ALD) or other like deposition processes. The encapsulation layer 232 may be formed of silicon-boron-carbon nitride, silicon-carbon nitride, silicon nitride, combinations of these, or other dielectric with insulating and/or protective chemical barrier properties for protecting the pillar 226. After the encapsulation layer 232 is formed, lithography and/or etching may be used to expose a top surface 234 of the SOT free layer 220, and a top surface 236 of the second metal layer 206. In certain embodiments, the encapsulation layer 232 may be etched using a directional etch, so horizontally oriented portions (i.e., over the top surface 234 of the SOT free layer 220 and the top surface 236 of the first metal layer 204) are etched while vertically oriented portions are not etched (i.e., the encapsulation layer 232 therefore remains around the pillar 226).

Figure 7:
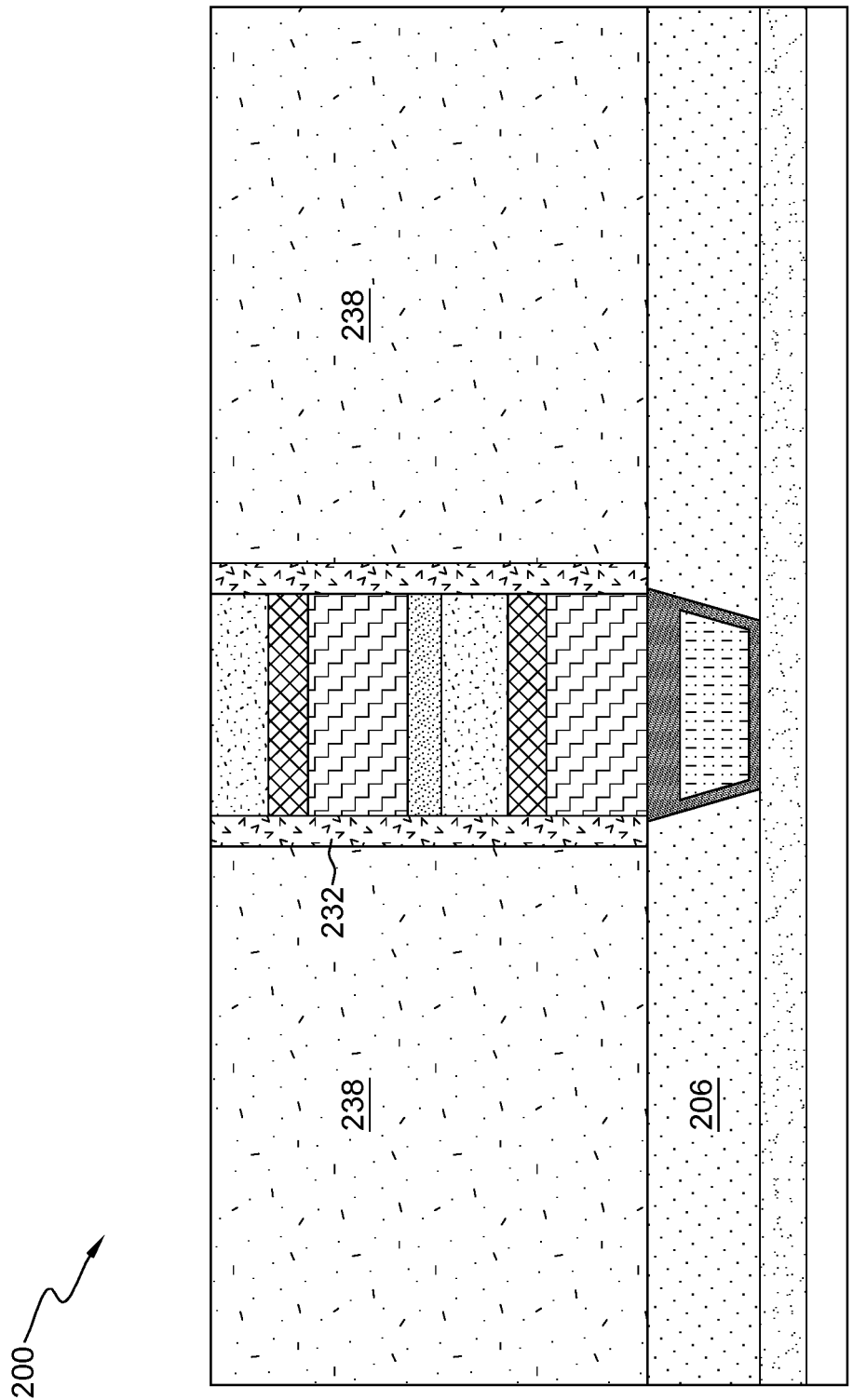
FIG. 7 depicts a cross-sectional side view of a semiconductor structure, with like reference numerals of previous figures referring to like features, and at a fabrication stage of the processing method that is subsequent to the directly previous figure, in accordance with one embodiment of the present invention.

FIG. 7 depicts a cross-sectional view of the semiconductor structure 200 at a fabrication stage of the processing method, in accordance with one embodiment of the present invention. The semiconductor structure 200 includes an interlayer dielectric (ILD) 238 formed around the pillar 226. The ILD 238 may be a non-crystalline solid material such as silicon dioxide (SiO2) undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used in the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD 238. The use of a self-planarizing dielectric material as ILD 238 may avoid the need to perform a subsequent planarizing step.

In some embodiments, the ILD 238 can be formed on the second metal layer 206 utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD 238, a planarization process or an etch back process follows the deposition of the dielectric material that provides the ILD 238.

Figure 8:
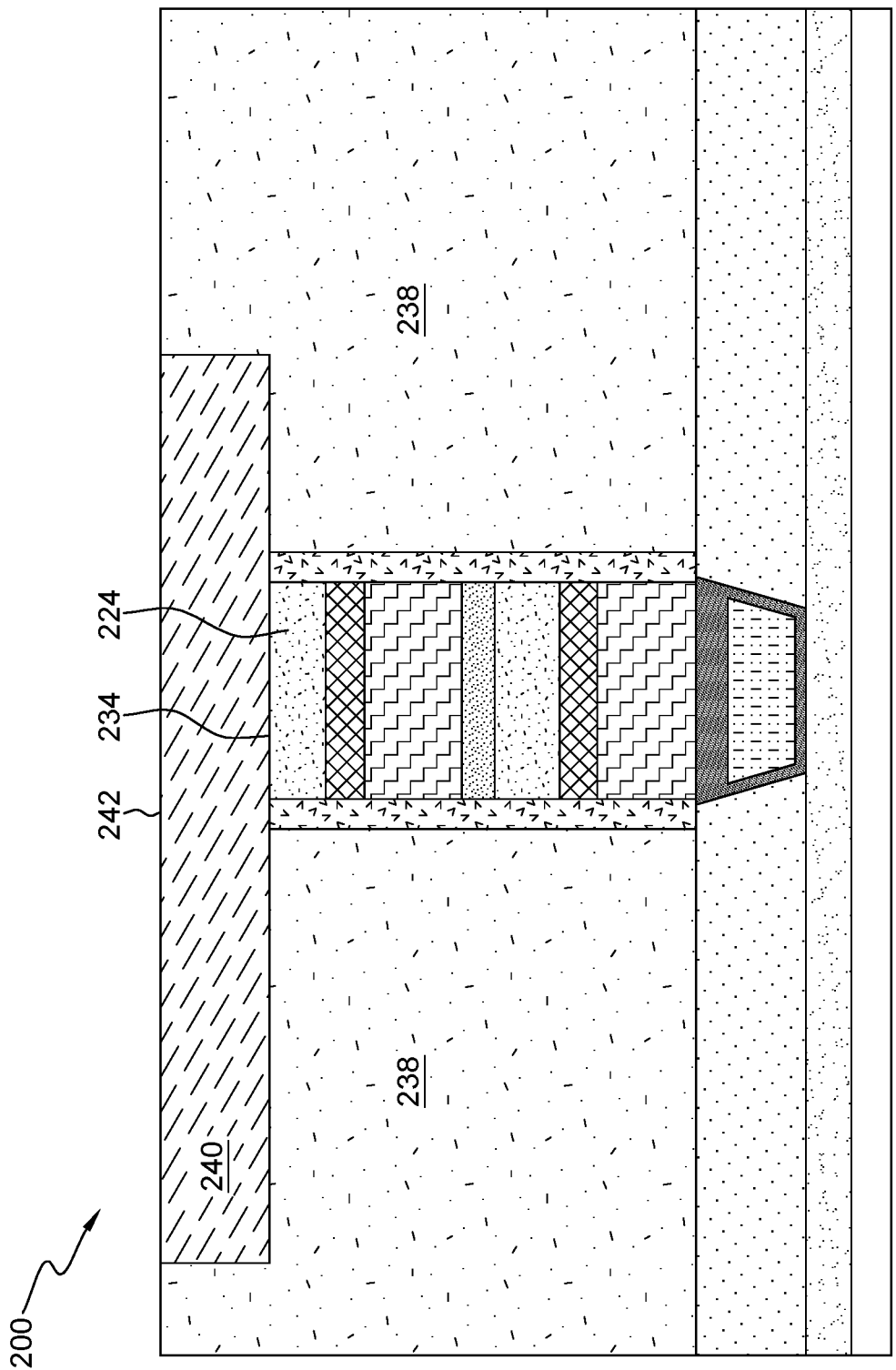
FIG. 8 depicts a cross-sectional side view of a semiconductor structure, with like reference numerals of previous figures referring to like features, and at a fabrication stage of the processing method that is subsequent to the directly previous figure, in accordance with one embodiment of the present invention.

FIG. 8 depicts a cross-sectional view of the semiconductor structure 200 at a fabrication stage of the processing method, in accordance with one embodiment of the present invention. The semiconductor structure 200 includes a heavy metal spin Hall effect (HM SHE) layer 240 deposited on the top surface 234 of the SOT free layer 224. The ILD 238 may also be formed around the HM SHE layer 240 such that the top of the ILD 238 is a top surface 242 of the HM SHE layer 240 rather than the top surface 234 of the SOT free layer 224. The HM SHE layer 240 may be formed of platinum, tantalum, tungsten, and palladium using deposition methods such as CVD, PECVD, PVD, sputtering, ALD, or other like deposition processes.

Additional fabrication processes may be completed before or after the illustrated processing method. Regardless of any additional fabrication steps, however, the STT-MRAM stack 228 changes resistance by flipping the magnetic orientation of the STT free layer 214 with a vertical electrical signal through the STT-MRAM stack 228 (as described above with respect to the schematic of FIG. 1). Likewise, the SOT-MRAM stack 230 may also have a resistance changed by flipping the magnetic orientation of the SOT free layer 224 The magnetic orientation may be flipped using a vertical electrical signal through the SOT-MRAM stack 230 or using a horizontal electrical signal through the HM SHE layer 240. In certain embodiments, the semiconductor structure 200 may include two STT-MRAM stacks 228 rather than the STT-MRAM stack 228 and the SOT-MRAM stack 230. In embodiments with only STT-MRAM stacks 228, however, only vertical electron flow (i.e., vertically up 120 or vertically down 122) can be used to change the state. The drawback of using only vertical electron flow to change the state is that attempts at separated control for each individual STT-MRAM stack 228 are more likely to suffer from inaccuracy. Specifically, the stochastic nature of MRAMs may cause a disturbance during an attempt to change a single STT-MRAM stack 228. That is, attempting to change just a top STT-MRAM stack 228 can unpredictably cause a bottom STT-MRAM stack 228 to also be changed.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a spin transfer torque (STT) magnetoresistive random access memory (MRAM) stack, comprising:
an STT reference layer comprising a fixed magnetic field; and
an STT free layer configured to flip an STT magnetic orientation in response to a vertical signal through the STT reference layer and the STT free layer; and
a spin orbit torque (SOT)-MRAM stack vertically in series with the STT-MRAM comprising:
a heavy metal spin hall effect (SHE) rail configured to flip an SOT free-layer magnetic orientation in response to a horizontal signal through the heavy metal SHE rail;
an SOT reference layer different from the STT reference layer; and
an SOT free layer configured to flip the SOT free-layer magnetic orientation in response to a vertical signal through the SOT-MRAM.

2. The semiconductor structure of claim 1, further comprising a bottom electrode vertically below the STT-MRAM stack.

3. The semiconductor structure of claim 2, further comprising a front end of line (FEOL) layer comprising transistor devices vertically below the bottom electrode.

4. The semiconductor structure of claim 1, wherein the heavy metal SHE rail comprises a selection from the group consisting of: platinum, tantalum, tungsten, and palladium.

5. The semiconductor structure of claim 1, further comprising a tunnel barrier between the STT reference layer and the STT free layer.

6. The semiconductor structure of claim 1, further comprising a tunnel barrier between the SOT reference layer and the SOT free layer.

7. The semiconductor structure of claim 1, further comprising an encapsulation layer around the STT-MRAM stack and the SOT-MRAM stack.

* * * * *